United States Patent
Wu et al.

(10) Patent No.: US 11,068,641 B1
(45) Date of Patent: Jul. 20, 2021

(54) SYSTEMS AND METHODS FOR INTELLIGENTLY BUFFER TRACKING FOR OPTIMIZED DATAFLOW WITHIN AN INTEGRATED CIRCUIT ARCHITECTURE

(71) Applicant: Mythic, Inc., Austin, TX (US)

(72) Inventors: Pei-Ci Wu, Millbrae, CA (US);
Andrew Morten, Cupertino, CA (US);
Anthony Romano, Austin, TX (US);
Balaji Iyer, Austin, TX (US);
Alexander Dang-Tran, Austin, TX (US); Eric Stotzer, Austin, TX (US);
David Fick, Cedar Park, TX (US)

(73) Assignee: Mythic, Inc., Austin, TX (US)

( * ) Notice: Subject to any disclaimer, the term of this patent is extended or adjusted under 35 U.S.C. 154(b) by 0 days.

(21) Appl. No.: 17/192,302

(22) Filed: Mar. 4, 2021

Related U.S. Application Data

(60) Provisional application No. 62/984,934, filed on Mar. 4, 2020, provisional application No. 63/028,180, filed on May 21, 2020.

(51) Int. Cl.
*G06F 30/398* (2020.01)
*G06N 3/063* (2006.01)

(52) U.S. Cl.
CPC .......... *G06F 30/398* (2020.01); *G06N 3/063* (2013.01)

(58) Field of Classification Search
CPC .............................. G06F 30/398; G06N 3/063
See application file for complete search history.

(56) References Cited

U.S. PATENT DOCUMENTS

| | | | | |
|---|---|---|---|---|
| 9,335,977 | B2 * | 5/2016 | Wang | G06F 9/4494 |
| 10,102,039 | B2 * | 10/2018 | Jovanovic | G06F 9/5066 |
| 10,579,524 | B1 * | 3/2020 | Mattina | G06F 9/45558 |
| 2009/0235251 | A1 * | 9/2009 | Li | G06F 9/54 |
| | | | | 718/100 |
| 2018/0188997 | A1 | 7/2018 | Fleming, Jr. et al. | |
| 2019/0340010 | A1 | 11/2019 | Lee et al. | |

FOREIGN PATENT DOCUMENTS

CN              103970602 A   *   5/2017   ............... G06F 9/48

OTHER PUBLICATIONS

International Application No. PCT/US2021/020872, International Search Report and Written Opinion dated May 25, 2021, 7 pages.

\* cited by examiner

*Primary Examiner* — Vuthe Siek

(74) *Attorney, Agent, or Firm* — Padowithz Alce; Alce PLLC

(57) ABSTRACT

Systems and methods for optimizing data flow in an integrated circuit includes creating a task graph based on transforming an optimized network graph for a neural network application, wherein creating the task graph includes: enumerating a plurality of distinct tasks based on a decomposition of each of a plurality of network operations of the optimized network graph; and allocating a data buffer to each of pairs of dependent tasks of the plurality of distinct tasks based on the decomposition of each of the plurality of network operations of the optimized network graph; encoding a token-informed task scheduler based on a composition of the task graph, wherein the encoding the token-informed task scheduler includes: programming the token-informed task scheduler to cause an execution of the plurality of distinct tasks based on identifying a state of a respective data buffer between each of the pairs of dependent tasks.

15 Claims, 8 Drawing Sheets

200

BUILDING DIRECTED NETWORK GRAPH S210

OPTIMIZING THE NETWORK GRAPH S220

CONSTRUCTING A TASK GRAPH S230

OPTIMIZING THE TASK GRAPH S240

IDENTIFYING CONFIGURATION PARAMETERS FOR FSB S250

GENERATING BUFFER AND FSB PROGRAM CODE S260

FIGURE 2

SYSTEMS AND METHODS FOR INTELLIGENTLY BUFFER TRACKING FOR OPTIMIZED DATAFLOW WITHIN AN INTEGRATED CIRCUIT ARCHITECTURE

CROSS-REFERENCE TO RELATED APPLICATIONS

This application claims the benefit of U.S. Provisional Application No. 62/984,934, filed 4 Mar. 2020, and U.S. Provisional Application No. 63/028,180, filed 21 May 2020, which are both incorporated herein in their entireties by this reference.

TECHNICAL FIELD

The inventions described herein relate generally to the integrated circuitry architecture field, and more specifically to new and useful intelligent integrated circuits and methods of computing with the intelligent integrated circuit in the integrated circuitry architecture field.

BACKGROUND

Today, the various implementations of artificial intelligence and machine learning are driving innovation in many fields of technology. Artificial intelligence (AI) systems and artificial intelligence models (including algorithms) are defined by many system architectures and models that enable machine learning (deep learning), reasoning, inferential capacities, and large data processing capabilities of a machine (e.g., a computer and/or a computing server). These AI systems and models are often trained intensively to perform one or more specific tasks, such as natural language processing, image recognition, planning, decision-making, and the like. For example, a subset of these AI systems and models include artificial neural network models. The training of an artificial neural network model may, in many cases, require thousands of hours across the training cycle and many terabytes of training data to fine tune associated neural network algorithm(s) of the model before use.

However, once trained, a neural network model or algorithm may be deployed quickly to make inferences to accomplish specific tasks (e.g., recognizing speech from speech input data, etc.) based on relatively smaller datasets when compared to the larger training datasets used during the training cycle. The inferences made by the neural network model or algorithm based on the smaller datasets may be a prediction about what the neural network model calculates to be a correct answer or indication about a circumstance.

Still, while neural network models implementing one or more neural network algorithms may not require a same amount of compute resources, as required in a training phase, deploying a neural network model in the field continues to require significant circuitry area, energy, and compute power to classify data and infer or predict a result. For example, weighted sum calculations are commonly used in pattern matching and machine learning applications, including neural network applications. In weighted sum calculations, an integrated circuit may function to multiply a set of inputs ($x_i$) by a set of weights ($w_i$) and sum the results of each multiplication operation to calculate a final result (z). Typical weighted sum calculations for a machine learning application, however, include hundreds or thousands of weights which causes the weighted sum calculations to be computationally expensive to compute with traditional digital circuitry. Specifically, accessing the hundreds or thousands of weights from a digital memory requires significant computing time (i.e., increased latency) and significant energy.

Accordingly, traditional digital circuitry required for computing weighted sum computations of a neural network model or the like tend to be large to accommodate a great amount of digital memory circuitry needed for storing the millions of weights required for the neural network model. Due to the large size of the circuitry, more energy is required to enable the compute power of the many traditional computers and circuits.

Additionally, these traditional computers and circuits for implementing artificial intelligence models and, namely, neural network models may be suitable for remote computing processes, such as in distributed computing systems (e.g., the cloud), or when using many onsite computing servers and the like. However, latency problems are manifest when these remote artificial intelligence processing systems are used in computing inferences and the like for remote, edge computing devices or in field devices. That is, when these traditional remote systems seek to implement a neural network model for generating inferences to be used in remote field devices, there are unavoidable delays in receiving input data from the remote field devices because the input data must often be transmitted over a network with varying bandwidth and subsequently, inferences generated by the remote computing system must be transmitted back to the remote field devices via a same or similar network. Additionally, these traditional circuit often cannot manage the computing load (e.g., limited storage and/or limited compute) and may often rely on remote computing systems, such as the cloud, to perform computationally-intensive computations and store the computation data (e.g., raw inputs and outputs). Thus, constant and/or continuous access (e.g., 24×7 access) to the remote computing systems (e.g., the cloud) is required for continuous operation, which may not be suitable in many applications either due to costs, infrastructure limitations (e.g., limited bandwidth, low grade communication systems, etc.), and the like.

Implementing AI processing systems at the field level (e.g., locally at the remote field device) may be a proposed solution to resolve some of the latency issues. However, attempts to implement some of these traditional AI computers and systems at an edge device (e.g., remote field device) may result in a bulky system with many circuits, as mentioned above, that consumes significant amounts of energy due to the required complex architecture of the computing system used in processing data and generating inferences. Thus, such a proposal without more may not be feasible and/or sustainable with current technology.

Accordingly, there is a need for a deployable system for implementing artificial intelligence models locally in the field (e.g., local AI), and preferably to be used in edge devices, that do not result in large, bulky (edge) devices, that reduces latency, and that have necessary compute power to make predictions or inferences, in real-time or substantially real-time, while also being energy efficient.

The below-described embodiments of the present application provide such advanced and improved integrated circuits and implementation techniques capable of addressing the deficiencies of traditional systems and integrated circuit architectures for implementing AI and machine learning.

BRIEF SUMMARY OF THE EMBODIMENTS

In one embodiment, a method for optimizing data flow in an integrated circuit based on state data of one or more data buffers includes (A) creating a task graph based on transforming an optimized network graph for a neural network application, wherein creating the task graph includes: (i-a) enumerating a plurality of distinct tasks based on a decomposition of each of a plurality of network operations of the optimized network graph; and (ii-a) allocating a data buffer to each of one or more distinct pairs of dependent tasks of the plurality of distinct tasks based on the decomposition of each of the plurality of network operations of the optimized network graph; (B) encoding a token-informed task scheduler based on a composition of the task graph, wherein the encoding the token-informed task scheduler includes: programming the token-informed task scheduler to cause an execution of one or more of the plurality of distinct tasks based on identifying a state of a respective data buffer between each of the one or more distinct pairs of dependent tasks.

In one embodiment, the encoding the token-informed task scheduler includes: programming the token-informed task scheduler to: (1) track a plurality of distinct tokens emitted by one or more distinct components of the integrated circuit; and (2) identify whether a collection of the plurality of distinct tokens satisfy one or more task launching conditions associated with one or more of the plurality of distinct tasks.

In one embodiment, (1) the decomposition of each of the plurality of network operations includes: translating each of the plurality of network operation of the optimized network graph to a set of task sequences that includes a set of the plurality of distinct tasks arranged in chronologically dependent order, (2) allocating the data buffer includes: allocating an instance of the data buffer between each sequential pair of tasks in the set of task sequences.

In one embodiment, identifying the state of the respective data buffer includes: identifying one or more tokens that are emitted by a component of the integrated circuit based on an execution of one or more dependent tasks of the plurality of distinct pairs of dependent tasks performing one of a read operation of and a write operation to the respective data buffer.

In one embodiment, each of a first dependent task and a second dependent task of a distinct pair dependent tasks of the plurality of distinct pairs of dependent tasks interface through the respective data buffer allocated between the distinct pair of dependent tasks.

In one embodiment, encoding the token-informed task scheduler includes: programming a distinct task launching condition for each of the plurality of distinct tasks, wherein the distinct task launching condition includes a requirement that one or more distinct tokens be observed within the integrated circuit based on a completion of one or more tasks.

In one embodiment, the method includes programming one or more token counters for the distinct task launching condition, wherein the one or more token counters count one or more distinct tokens emitted by one or more components of the integrated circuit.

In one embodiment, identify the state of the respective target buffer includes: evaluating a value of the one or more token counters against the distinct task launching condition for each of the plurality of tasks.

In one embodiment, the token-informed task scheduler tracks one or more of a read token and a write token produced based on a distinct pair of tasks performing one or more of a read operation of and a write operation to the respective data buffer associated with the distinct pair of tasks.

In one embodiment, each of the one or more distinct pairs of dependent tasks includes: (1) a first task that performs a write operation to the at least one data buffer; and (2) a second task that performs one of a read operation and a write operation to the at least one data buffer only after a completion of the first task.

In one embodiment, each of the one or more distinct pairs of dependent tasks includes: (1) a first task that performs a read operation to the at least one data buffer; and (2) a second task that performs one of a read operation and a write operation to the at least one data buffer only after a completion of the first task.

In one embodiment, a first dependent task of the one or more distinct pairs of dependent tasks interfacing with the respective data buffer causes an emission of a distinct token that is tracked by the token-informed task scheduler to cause an automatic execution of a second dependent task of the one or more distinct pairs if the distinct token causes a satisfaction of a task launching condition of the second dependent task.

In one embodiment, a system for optimizing data flow and an execution of integrated circuit tasks in an integrated circuit includes a main data buffer; a token-informed task scheduler; a computer implementing an intelligent compiler program that creates a task graph based on transforming an optimized network graph for a neural network application, wherein creating the task graph includes: (i-a) enumerating a plurality of distinct integrated circuit tasks based on a decomposition of each of a plurality of network operations of the optimized network graph; and (ii-a) allocating a data buffer slice of the main data buffer to each of one or more distinct pairs of dependent integrated circuit tasks of the plurality of distinct integrated circuit tasks based on the decomposition of each of the plurality of network operations of the optimized network graph; wherein the computer encodes a token-informed task scheduler based on a composition of the task graph, wherein the encoding the token-informed task scheduler includes: programming the token-informed task scheduler to cause an execution of one or more of the plurality of distinct integrated circuit tasks based on identifying a state of a respective data buffer between each of the one or more distinct pairs of dependent integrated circuit tasks.

In one embodiment, the encoding the token-informed task scheduler includes: programming the token-informed task scheduler to: (1) track a plurality of distinct tokens emitted by one or more distinct components of the integrated circuit; and (2) identify whether a collection of the plurality of distinct tokens satisfy one or more task launching conditions associated with one or more of the plurality of distinct integrated circuit tasks.

In one embodiment, the computer encodes a task token counter to increment or decrement based on one or more occurrences of one or more distinct task tokens within the integrated circuit; and the encoding the token-informed task scheduler includes encoding one or more task launching conditions that, when satisfied by one or more occurrences of the one or more distinct task tokens, causes the token-informed task scheduler to automatically launch one or more of the plurality of distinct integrated circuit tasks.

BRIEF DESCRIPTION OF THE FIGURES

FIG. 2 illustrates a method of implementing buffer tracking for dataflow in a mixed-signal computing architecture in accordance with one or more embodiments of the present application;

DESCRIPTION OF THE PREFERRED EMBODIMENTS

Figure 1:
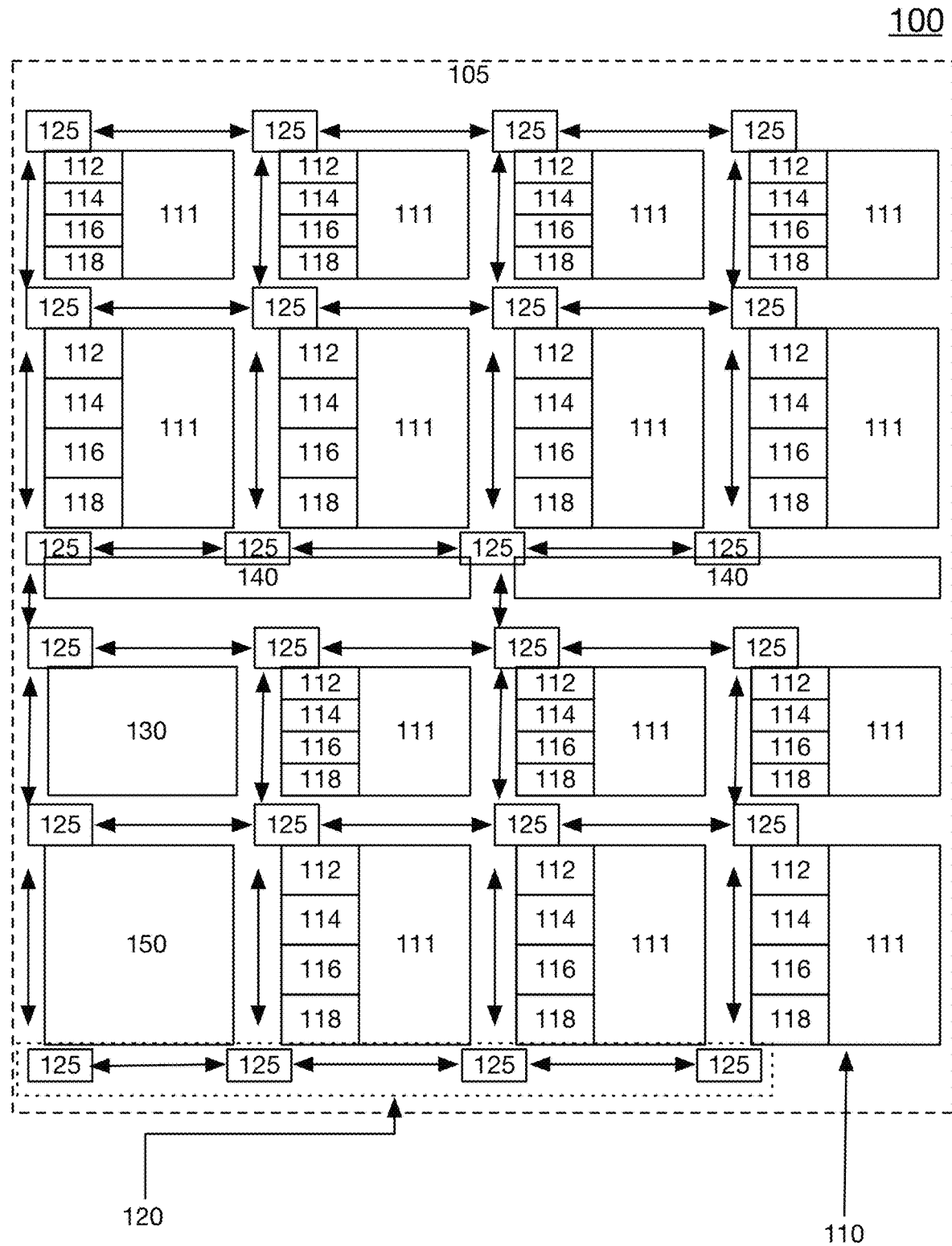
FIGS. 1-1A illustrates a schematic of an intelligence integrated circuit 100 in accordance with one or more embodiments of the present application.

The following description of preferred embodiments of the present application are not intended to limit the inventions to these preferred embodiments, but rather to enable any person skilled in the art of to make and use these inventions.

1. Intelligence Processing Overview

Embodiments of the present application provide a flexible and reprogrammable system that can be programmed to accommodate various computationally-intensive applications or programs of varying complexity and size. While a physical configuration of an integrated circuit architecture according to one or more embodiments of the present application may remain the same or substantially the same, disparate processing elements within the architecture may be programmed to handle multiple applications or one or more sections of a single application.

Further, an implementation and particular arrangement of the storage devices implemented within one or more embodiments of the present application provide several technical benefits over state-of-the-art integrated circuits, including reducing a total requirement of memory or storage required for handling data-intensive applications or programs. For instance, in one embodiment, a distributed memory may include a main (large) buffer may be provided to receive input data (e.g., raw input data or data from an upstream layer or source) and each of a plurality of disparate local buffers may be arranged together with a computing element (e.g., a matrix multiply accelerator) 111. In such embodiment, each local buffer may be arranged adjacent to or in an immediate vicinity of the computing element for fast access and therefore, efficient processing of input data from the main buffer.

Additionally, such an arrangement may allow for asynchronous processing of data along a data processing pipeline thereby enabling multiple segments of data to be processed at a same time and possibly in different stages along the pipeline. That is, in some embodiments, the asynchronous processing of data by the one or more components of the integrated circuit may enable a processing of a plurality of distinct sets of data that may not be in perfect lockstep while enabling simultaneous and/or parallel workflows along distinct components of a data processing pipeline. Such embodiments, the requirement for duplication of data may be significantly reduced.

Additionally, one or more embodiments of the present application may function to implement a token-driven data processing system in which a central process control may not be required.

Specifically, in one or more embodiments, an integrated circuit of the present application may include an architecture that may trigger microprocessor (e.g., a nano-processor which may include a microcontroller that may be local to each compute tile of an integrated circuit) programs and/or applications using tokens. A token as referred to herein preferably relate to a piece of data that evidences or represents an occurrence or an existence of a computing event or transaction and may, additionally or alternatively, evidence or represent a state of one or more components of an integrated circuit. In a non-limiting example, in the circumstances in which a token represents a state of an integrated circuit component, the token may indicate whether a buffer is empty or full, occupied or unoccupied, whether a processor is On or Off, busy (processing) or not busy (not processing), whether an item is processed or unprocessed, and/or the like. While, in many embodiments described herein, the tokens may be used for automatically triggering an execution and/or implementation of programs or applications, in various implementations the tokens may be used to trigger other units. A few examples include, using a combination of one or more instances or one or more tokens may indicate that an action or transaction of an integrated circuit has permission to proceed; possibly, meaning that all of the dependent actions of the action or transaction have occurred. Thus, the tokens may be used to trigger finite state machines, trigger a release of a packet or a work-queue item, trigger the generation of another token, and/or the like. There may be limitless applications of the token-based governance module (sometimes referred to herein as the flow scoreboard module), described in several of the embodiments, for automatically triggering any type and/or any number of functions/operations with the integrated circuit.

In a preferred embodiment of the present application, the integrated circuit architecture may include a network-on-chip system that enables a communication and/or passing of tokens between distinct components of the integrated circuit. Accordingly, in some embodiments, the tokens may represent pieces of dependencies that enable components of the integrated circuit to receive new workloads triggered by an appropriate combination and/or count of one or more tokens. However, it shall be noted that any suitable token communication scheme and/or interconnect may be used including, but not limited to, serial communication buses or the like. For instance, in one embodiment of the present application, a token may not be released and/or generated (irrespective of an interconnect) until an associated triggering event is completed (e.g., an emptying of a local data buffer, a computation by an MMA or the like against input data, and/or any suitable event). In yet another embodiment, a token may be generated and/or released in advance of an associated triggering event if the early release of the token would not cause ordering constraints to be violated. Accordingly, in several of the embodiments of the present application, it shall be noted that the tokens can be deployed in any suitable manner to achieve a token-based control of the flow of data and/or the processing of data throughout an integrated circuit.

Additionally, the token-based governance module described herein may generally function to enable a token-based control by tracking tokens and token triggering conditions and the like. The token-based governance module may have configurable constraints so that triggering may also depend on a state of a local unit or circuit and not only based on a number of tokens identified or received. That is, in several embodiments of the present application, data flow, data processing, one or more operations/functions and the like may be governed based on the release or generation of tokens, it shall be noted that simply determining and/or identifying a state of a component of the integrated circuit and/or identifying a state of a process or operation within the integrated circuit may serve as a triggering event for yet automating another operation, function, process, or flow. For instance, a state of the utilization (e.g., depth) and/or capacity of one or more work queues may function as a triggering event. A technical benefit of such embodiments may be that an operation may only run when computing resources (e.g., space with the one or more work queues) that may be required are available. Accordingly, the embodiments of the present application may provide a flexibility in how events and/or dependencies are configured that trigger an automated operation, function, or process and therefore, allow for the generation of more complex programs or applications that use greater resources or resources more efficiently, which improves an operating efficiency of the one or more systems described herein by reducing a number of events that need to be generated in order to perform some action.

It shall be noted that, in some embodiments, various and/or different tokens may be implemented by a token-based data processing integrated circuit, as described in more detail as in U.S. Pat. No. 10,606,797, which is incorporated herein in its entirety by this reference. In some embodiments, a triggering condition for performing an action within the integrated circuit may be achieved by a minimum number of counts of each of several distinct token types.

1.1 Buffer Tracking for Dataflow Architecture Overview

A mixed-signal computing tile array may have a number of challenges which may include how to assign a given task to the limited computing resources (e.g., available processing, memory, etc.), limited communication bandwidth between tiles, managing data flow of concurrent running tasks, determining when the dependencies for a task may have been met which may be a prerequisite of the task being able to execute, and decomposing tasks too large to fit into a single tile such that the task may be divided among multiple tiles and the results combined. The system performance may be improved by efficient communication between various tiles and circuits within a tile, scheduling a task to run as quickly as possible once the task dependencies have been met along with the computing resources being available, and starting tasks once a sufficient amount of data has arrived.

In one or more preferred embodiments, tasks may communicate via shared buffers which may reduce the amount of data being moved within the system. Scheduling when a task can access and/or write to the buffer and when a task can run may be controlled with a flow score board (FSB). The FSB may trigger task execution based on the state of the input buffers and/or the output buffers. The FSB may utilize a queue, e.g., a first-in first-out (FIFO) queue, to allow part of the buffer to be read while another section of the buffer has the next set of data written to it. When the FSB and buffers are configured, the buffers may be sized such that tasks can both write to and read from the buffer which may enable the system to overlap communication and computation. For an example of an FSB, reference is made to U.S. Pat. No. 10,521,395 titled "SYSTEM AND METHODS FOR IMPLEMENTING AN INTELLIGENCE PROCESSING COMPUTING ARCHITECTURE", which is incorporated in its entirety by this reference. In one or more preferred embodiments, a task too large to fit on a single tile may be split into multiple tasks to be executed on additional tiles and the result of each of these multiple tasks may be combined once all the processing is complete, and the FSB may synchronize the concurrent processing and combine the results of the concurrent processing into a final result.

2. Intelligence Processing Computing Architecture

Figure 1A:
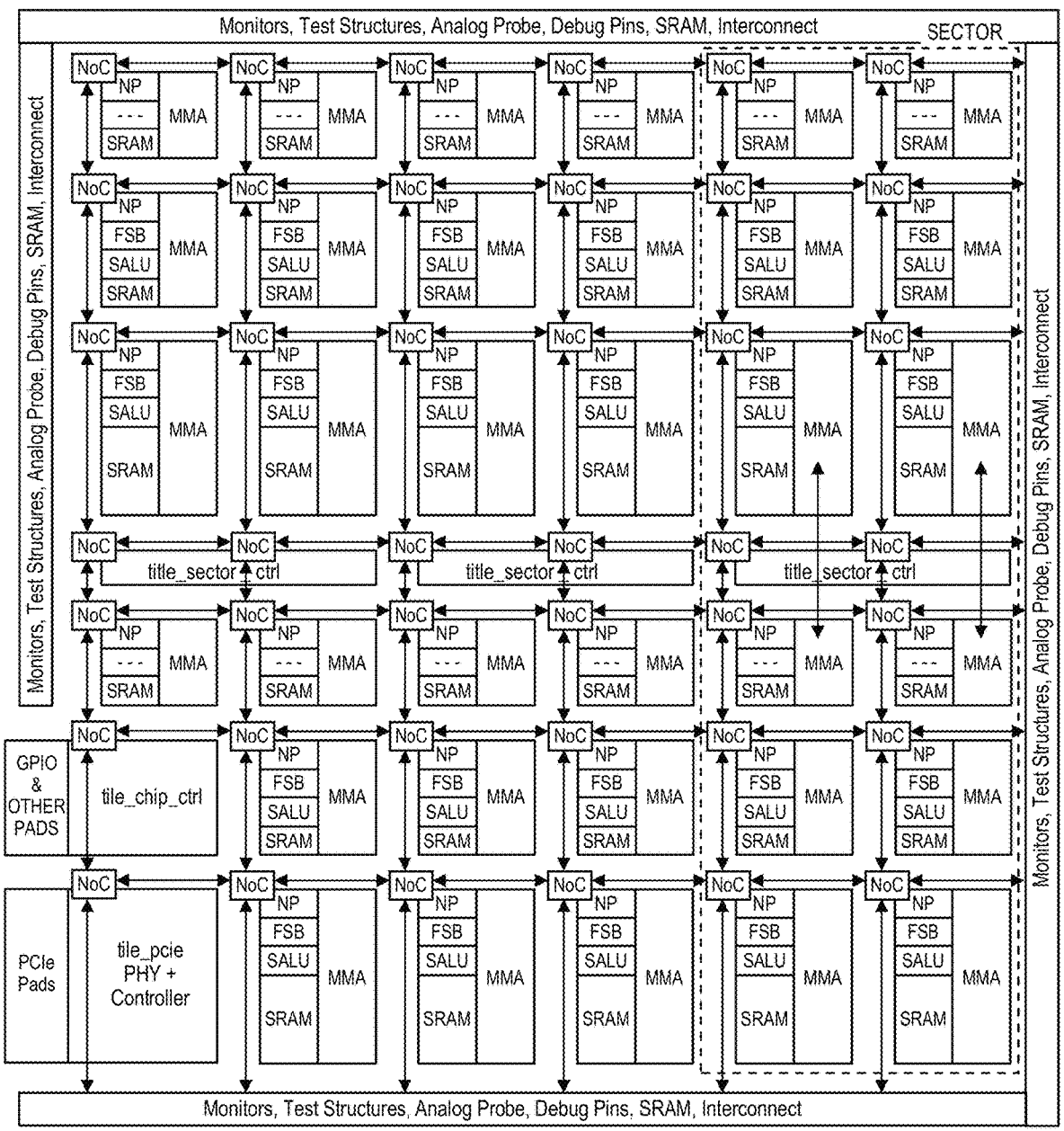

As shown in FIGS. 1-1A, an intelligence processing computing architecture 100 (or alternately referred to herein as an intelligence processing integrated circuit 100) for processing computationally-intensive programs and/or applications (e.g., machine learning applications, neural networks, etc.) includes an intelligence processing array 105 that includes a plurality of intelligence (computing) processing (tiles) units 110, a network on chip system 120 that includes a plurality of network-on-chip routers 125, an integrated circuit controller circuit 130, tile sector controller circuit 140, and a serial connection bus 150. Preferably, each of the plurality of intelligence processing units 110 includes a matrix multiply accelerator in (may also be referred to herein as an accelerator circuit), a computer processing circuit (e.g., a microprocessor, a nano-processor, or the like) 112, a flow scoreboard (token-based governance) module 114, a single instruction multiple data (SIMD) unit 116 (e.g., streaming arithmetic logic unit or the like), and a local buffer (e.g., static random access memory (SRAM) or the like) 118. In some embodiments, a local data buffer 18 may be implemented by an SRAM controller that may include, at least, a SRAM storage or circuit, one or more data transfer engines or circuits (e.g., a DMA controller) that may be used to move data to and/or from the SRAM and other computing resources, an arbitration scheme that selects which controller has access to the SRAM at a given time. Additionally, in one preferred embodiment, each of 130, 140, and 150 may include a computer processing circuit 112, a flow scoreboard module 114, a SIMD 116, and a local data buffer 118. In one or more embodiments, the local data buffer 118 may sometimes be referred to herein as an on-tile memory or on-tile buffer indicating that the local data buffer 18 may be arranged within an intelligence processing tile no and in direct communication with various or one or more circuits, components, and/or modules within the intelligence processing tile no. FIG. 1A includes a further detailed embodiment of the intelligence processing computing architecture 100 and includes additional peripheral interconnects for interfacing with the intelligence processing array 105. For instance, test structures, monitors, analog probes, and/or any suitable peripheral device may be connected along or arranged along the periphery of the intelligence processing array 105 of the intelligence computing architecture 100.

While in one or more preferred embodiments an intelligence processing unit no may include a matrix multiply accelerator in, a computer processing circuit 112, a flow scoreboard module 114, a SIMD unit 116, and a local buffer 118, it shall be noted that an intelligence processing unit no may include any suitable combination of circuits and modules and therefore, may exclude one or more of the aforementioned circuits and modules and/or may include any combination of the aforementioned circuits and modules without meaningfully departing from the scope of the inventions described in the present application. For instance, in some embodiments, an intelligence processing unit no may include or consist of a flow scoreboard module 114 and a local buffer 118 (SRAM) without computational circuitry or the like (e.g., computer processing circuit 112). In another example, an intelligence processing unit 110 may include or consist of a flow scoreboard module 114, a local buffer 18 (SRAM), and an off-chip interface (e.g., USB, PCIe, HDMI, MIPI-CSI, I2C, ethernet, Bluetooth, and/or any suitable off-chip interface component).

Additionally, or alternatively, while processing within the architecture 100 may include analog processing components or the like, it shall be noted that the embodiments of the architecture 100 may also enable digital processing with any suitable circuitry including, but not limited to, embedded Field Programmable Gate Arrays (eFPGA), Systolic arrays, floating point units, and/or the like.

The intelligence processing array 105 (intelligence accelerator) preferably includes the plurality of distinct intelligence processing units 110 that may function to work in cooperation to execute a computationally-intensive application or the like. In some embodiments, the intelligence processing array 105 may function to define one or more intelligence processing pipelines that enables a processing of raw input data and/or data from an upstream device or process to a final output state. In such embodiment, each stage (e.g., by one or more disparate intelligence processing units 110 or the like) of the intelligence processing pipeline may be defined by a disparate intelligence processing unit 110 that may be specifically programmed to execute a fraction of an application or program. Each of the disparate intelligence processing units no of the intelligence processing array 105 preferably functions to operate or compute independently of other or heterogeneous intelligence processing units no within the intelligence processing array 105. Accordingly, because each stage of an intelligence processing pipeline may be configured with its own processing section (e.g., intelligence processing unit 110), each intelligence processing pipeline may function to processing input data independently along each stage within the pipeline thereby enabling considerable efficiencies in processing input. That is, asynchronous processing of data or raw input data may be achieved based on the independent processing and/or computations of respective intelligence processing units 110.

Additionally, or alternatively, each of the one or more intelligence processing pipelines defined within the intelligence processing array 105 may be flexibly configured to enable the execution of disparate (non-dependent) applications or programs within the single array 105 or flexibly configured to enable the execution of disparate sections of a single application or a single program along various intelligence processing units 110 within the array 105. For instance, a first neural network application may be programmed along a first section of the intelligence processing array 105 that includes a first collection of intelligence processing units no and a second neural network application may be programmed along a second section of the intelligence processing array 105 that includes a second disparate collection of intelligence processing units 110. In a second example, a single computationally-intensive application (e.g., a neural network or the like) may be partitioned into sub-applications (or programs) and each section programmed to a different intelligence processing unit 110 within an array 105. Additionally, or alternatively, in this second example, multiple sections of an application or multiple sub-applications may be programmed to a same intelligence processing unit 110. In yet another example, a plurality of intelligence processing units no may be conglomerated to perform one or more sub-sections of a single application or a single program. That is, individual intelligence processing units 110 may be used to implement only a section of an application or a program and thus, the entirety of the application or the program is handled by a plurality of intelligence processing units 110 that each process only a section of the overall application or program. It shall be noted that the integrated circuit array 105 and/or each intelligence processing units 100 may function to compute the multiple distinct applications and/or the multiple distinct partitions of a single application or single program in parallel (i.e., at the same time), contemporaneously (i.e., processing within a common time period, nearly the same time, etc.), or synchronously (i.e., processing independently of other processes and/or processing units 110). Additionally, it shall be noted that any suitable and/or type of application or program may be partitioned along the intelligence processing array 105 including applications and/or programs that may be partitioned into multiple operational stages that may have dependencies that can be represented as tokens.

The plurality of intelligence processing (tiles) units 110 preferably function to execute an application or a program against some input data received from an upstream device or an upstream layer, such as a buffer or another intelligence processing unit 110. As mentioned above, each of the plurality of intelligence processing units 110 includes a matrix multiply accelerator (e.g., a data processing circuit, or the like) 111, a computer processing circuit (e.g., a microprocessor) 112, a flow scoreboard module 114, a SIMD unit 116, and local data buffer 118 that enables each of the plurality of intelligence processing units 110 to accomplish and/or complete a processing of input data to output data and/or execute an application or program.

Each of the plurality of intelligence processing units 110 preferably functions to pull and/or accesses input data from its local buffer 118, compute against the input data at the matrix multiply accelerator in and output the results (output data) of the computation against the input data back into its local buffer 118 (or possibly to a local buffer of a downstream component or processing section).

In additionally and/or alternative embodiments of the present application, one or more distinct subsets (i.e., two or more) of the plurality of intelligence processing units 110 of the intelligence array may be clustered and/or conglomerated into a smaller chip (e.g., a chiplet, a system-in-a-package (SIP), 3D packaging, or the like) relative to the overall architecture 100. In such embodiments, a chiplet may be composed within the overall architecture 100 to make a full and/or independent chip. A technical benefit of such embodiments enables an enhanced level of customization of the architecture to be achieved.

In yet further embodiments, multiple integrated circuit architectures 100 may be combined and/or packaged together in a multi-chip architecture. In such embodiments, the multiple architectures 100 may be composed at a system or circuit board (panel) level. The interconnections between the multiple chips may be made using any suitable interconnect technique or interface, including PCIe or specially created bridge interfaces.

The flow scoreboard module 114 is preferably implemented by a combination of one or more computing processing circuits and flow scoreboard sub-modules. Additionally, the flow scoreboard module 114 may include a plurality of interfaces for implementing a flow control of data flowing through the one or more intelligence processing pipelines and a control of the execution of programs or the applications being handled by the one or more intelligence processing pipelines of the intelligence processing array 105.

In a preferred embodiment, the flow scoreboard module 114 may include a configuration interface, a token interface, and a notification interface. The configuration interface of the flow scoreboard 114 may be used to read and write an internal state of the flow scoreboard module 114, such as to program trigger conditions that when satisfied, in some embodiments, causes the integrated circuit via a nanoprocessor or the like to initiate a workload. The token interface of the flow scoreboard 114 may enable the intelligence integrated circuit 100 to present tokens to the flow scoreboard 114. In response to the presentation of a token via the token interface, the flow scoreboard 114 may function to update its internal state, and when necessary, update the notification interface according to token parameter values (e.g., token count values or the like, as discussed in further detail in the method 300) and a configuration of the flow scoreboard 114. The notification interface of the flow scoreboard may be implemented by the flow scoreboard module 114 to indicate to the intelligence integrated circuit 110 that one or more conditions (or prerequisites) for executing one or more programs have been satisfied. It shall be noted that the notification interface of the flow scoreboard module 114 may function to trigger any number of operations within the intelligence integrated circuit 110, for example, data transfer without an explicit program execution.

It shall be noted that the configuration interface, token interface, and/or notification interface may be implemented in any suitable manner including with a combination of modules executed by one or more processing circuits, such as a microprocessor.

The network on chip system 120 that includes a plurality of network-on-chip routers 125 that function to establish a communication network between the disparate components of the intelligence integrated circuit 100. In one embodiment, each of the chip routers 125 may include dedicated input and output links for receiving and transmitting communications in the North, South, East, and West directions along the architecture 100 and specifically, within the intelligence processing array 105. In some embodiments, the network on chip system 120 enables each of the disparate intelligence processing units 110 to pass data between them, such that when one intelligence processing unit 110 completes processing input data to generate an output, the one intelligence processing unit 110 may function to pass the output via one or more of the network routers of the network on chip system to another intelligence processing unit and/or allow another intelligence processing unit 110 to grab the output data. As one example, the digital tokens and/or data packets may be carried along the plurality of network routers of the network on chip system 120.

The integrated circuit controller 130 preferably includes chip-level control logic, which includes boot logic, security features, clocking logic, and the like.

The tile sector controller circuit 140 preferably includes a high voltage portion or circuit of the intelligence processing computing architecture 100 that enables the reprogrammable non-volatile memories within the matrix multiply accelerator 111.

The serial connection bus 150 preferably includes one of a universal serial bus (USB) port and a peripheral component interconnect express (PCI express) interface and/or any suitable high-speed. In a preferred embodiment, raw input data (e.g., raw image data or the like) and/or processed input data (e.g., from an upstream device, an upstream layer, etc.) may be received at the serial connection bus 150 and passed into the system via a primary or main buffer component. Additionally, or alternatively, input data received at the serial connection bus 150 may be passed either into a primary buffer of the intelligence processing integrated circuit 100 or directly into a local buffer 118 of an intelligence processing unit 100 via the network on chip system 120. Additionally, or alternatively, the primary buffer, which is sometimes referred to herein as a main buffer, may also be referred to as an off-tile (off-unit) memory or buffer. In particular, since the main buffer operating with the architecture 100 may be arranged remotely from and off of an intelligence processing tile no, it may be considered an off-tile component.

Additionally, or alternatively, any suitable off-chip connection may be implemented for transmitting data into and/or out of an intelligence processing array 105 and/or throughout the intelligence integrated circuit 100. For instance, any suitable peripheral device including, but not limited to, an imaging device (e.g., a camera or image sensor), a host system (e.g., a system on chip) or workstation, another intelligence integrated circuit, and/or the like.

Accordingly, it shall be noted that any type or kind of data including tokens may be passed along the serial connection bus 150 or other suitable off-chip connection/interface. For instance, data (e.g., results of computations or other outputs, etc.) from the intelligence integrated circuit 100 may be sent out to another device or system via the serial connection bus 150 or off-chip connection. Thus, a flow control, as described in the one or more embodiments herein, may be extended from the intelligence integrated circuit 100 to other devices, when operably connected or interfacing, in some manner. That is, in some embodiments, token-based flow control may be enabled between multiple intelligence integrated circuits 100 or between a device and host.

3. A Method for Implementing Buffer Tracking for Dataflow Architecture

As shown in FIG. 2, a method 200 for implementing buffer tracking for dataflow in a mixed-signal computing architecture may include: building or receiving a directed computation graph S210, optimizing the directed computation graph S220, constructing a task graph S230, optimizing the task graph S240, identifying configuration parameters for the FSB S250, and generating tasks, buffer and FSB program code S260.

It shall be noted that each step of the method 200 may be executed in parallel on the same integrated circuit or on a network of integrated circuit components. In one or more embodiments, any or part of method 200 may be performed by any combination of software, hardware (e.g., integrated circuit), and firmware.

In one or more embodiments, the generating task, buffer and FSB program code created in S260 may be loaded by the mixed-signal computing device where the load may be a push by a host device, a pull request from the mixed-signal computing device, an automatic update, or another event in which there is a desire to have the mixed-signal computing device load the generating task, buffer and/or FSB program code.

3.1 Automatic Network Graph Construction

S210, which includes identifying an input of a directed graph or the like, may function to receive a graph or build a new graph illustrating one or more features and/or operations of an application or a program, such as a neural network application, a computationally-intensive algorithm, or the like. In some embodiments, the graph may represent a neural network application that comprises nodes and edges which identify the points of connections and the operation of the network (e.g., a flow of input and outputs of data between nodes). In such embodiments, the nodes may represent distinct network operations and edges between nodes may represent the dependencies, e.g., inputs and outputs from nodes, between network operations. In one or more embodiments, network operation operands may be rank-n tensors. It shall be noted that the graph, in some embodiments, may be described in any suitable data structure or language, e.g., an Open Neural Network Exchange (ONNX) format, Neural Network Exchange Format (NNEF), a C++ program, machine code, etc. In addition, or alternately, the graph may be described with a domain specific language (DSL).

Preferably, in one or more embodiments, S210 or a subset of S210 may be performed by a compiler, such as graph of compiler or a deep neural network compiler (dnn-complier). In some embodiments, the compiler may reside on a computing device or on a network computing device, e.g., server, cloud computing, and the like. In such embodiments, the compiler may function interactively with an administrator or be controlled by another application, or a combination of interactive and another application. In some embodiments, the compiler may be configured to automatically run based on certain conditions such as a lifetime of the network graph, events within the neural network, events happening in other applications, or any suitable event or condition.

Preferably, after reading a computation graph, the compiler may translate the computation graph into an intermediate representation (IR) where the IR captures the semantics of the computational graph of a given application. The IR may be used completely or in part for any of the remaining steps, e.g., steps S220, S230, S240, S250, and S260 or any other method or technique described herein. Additionally, or alternatively, the IR may be described with a domain specific language (DSL).

3.2 Operation Transformation

S220, which includes converting suboptimal (e.g., low-precision) sub-graph components to optimal (e.g., higher-precision) sub-graphs with optimization transformations, may function to transform graph nodes and edges into nodes and edges that may execute with extended capacities and/or improved performance. When making transformations parameters that affect system performance may be considered, e.g., tile constraints, accuracy, performance, memory usage, communication overheads, etc. For performing network transformations, reference is made to U.S. Pat. No. 10,929,748, filed on 17 Mar. 2020 titled "SYSTEMS AND METHODS FOR IMPLEMENTING OPERATIONAL TRANSFORMATIONS FOR RESTRICTED COMPUTATIONS OF A MIXED-SIGNAL INTEGRATED CIRCUIT", which is incorporated herein in its entirety by this reference. Any optimization may be used so long as it improves one or more system level performance metrics. According to an embodiment, when the graph representation created in S210 is in an optimized state then step S220 may not be executed and the algorithm may skip to S230.

3.3 Task Graph Construction & Annotation|Lowering Procedure

S230, which includes constructing a task graph, may function to include allocating tasks and buffers, and building a graphical representation of the same via the task graph. In a preferred embodiment, S230 may function to transform an optimized network graph (i.e., a High-Intermediate Representation) to a task graph (i.e., a Lo-Intermediate representation or machine code) that includes annotations for tasks and buffers and each operation included in a network graph. A task as referred to herein preferably relates to a unit of work executable by a compute unit of an integrated circuit (e.g., integrated circuit 100). In several embodiments of the present application, tasks may be executed by threads running on compute units.

In one or more preferred embodiments, a task graph, which may represent the relative execution order of tasks, may include nodes that represent tasks where tasks may implement a network operation, edges that may represent dependencies between tasks, and task operands that may be buffers, e.g., rank-N buffers. In a non-limiting example, a domain specific language description or graph (as constructed in S210) of a neural network may be transformed into a task graph. In one or more preferred embodiments, one or more of the tasks and/or buffers may be assigned to computing tiles.

In one or more embodiments, S230 may function to annotate a directed task graph with a plurality of distinct symbols and characters that may function to represent one or more of buffers (e.g., |B|), tasks (e.g., (T)), data flow edges (e.g., (T1)→|B|→(T2)), and the like. S230 may function to compose and augment to the task graph any suitable annotation that communicates the executional operations of the task graph. Additionally, or alternatively, S230 may function to decompose distinct (complex) tasks into a sequence of sub-tasks and local buffers. In such embodiments, S230 may function to ensure that each sub-task starts with a task (e.g., T1) and ends with a task (Tn). Additionally, or alternatively, a translation of the one or more network operations of a network graph may include decomposition of the network operations into a set of task sequences that includes a set of a plurality of distinct tasks arranged in chronologically dependent order and in some embodiments, with one or more data buffers injected between dependent tasks along the sequence. Thus, in some embodiments, S230 may function to allocate an instance of a data buffer between each sequential pair of tasks in the set of task sequences.

Accordingly, in one or more embodiments, S230 may function to perform task decomposition of a network graph to construct a task graph. In some embodiments, task decomposition may include a simple translation of a graph component, such as a neural network layer, of a network graph into a string or sequence of specific tasks and/or buffers. That is, S230 may function to convert a given network operation of a network graph into a string of executable tasks and buffers required to perform the given network operation by an integrated circuit. It shall be recognized that S230 may function to perform a simple translation of one graph component at a time or multiple interconnected graph components (e.g., two or more layers or nodes in a neural network).

Additionally, or alternatively, based on a complexity of a network operation of a network graph and processing constraints of an integrated circuit, S230 may function to distribute a work in a network operation (or a neural network layer) across a set of local task sequences. That is, in some embodiments, a task decomposition includes converting a single network graph operation (e.g., a neural network layer) into multiple strings of tasks.

According to a preferred embodiment, the lowering process may assign iterators and physical buffers for communication between tasks. As referred to herein, an iterator preferably relates to a descriptor that defines an iteration space of a loop nest that may generate an ordered sequence of buffer slices. In one or more embodiments, the descriptor may include various distinct tuples of positive integers including, for example, buffer_shape_view, domain, offset, window, stride, padding, num_steps, and/or the like. Accordingly, in one or more embodiments, each iteration of a loop may produce a buffer slice, which may include an output of the iteration of a loop written to an allocated space of the buffer. In such embodiments, the one or more elements of the buffer slice may service as input to or output from a relevant launcher in the order that the buffer slices appear, such as in a flat array view or the like.

A physical buffer as referred to herein preferably relates to a physical view of a buffer and where it physically resides in memory. In some embodiments, the physical buffer may be smaller than the logical buffer. Additionally, or alternatively, variations of a physical buffer may be implemented for communication between tasks, including but not limited to a circular buffer and a line buffer. A circular buffer preferably relates to a physical buffer with head and tail indices where elements are added to the head of the physical buffer and removed from the tail of the physical buffer. A line buffer preferably relates to a circular buffer used to represent a subset of a logical buffer.

3.4 Task Graph Optimization

S240, which includes optimizing the task graph, may function to modify the task graph by transforming one or more task graph elements into new task sub-graphs and local buffers which may improve the mapping to a mixed-signal tiled computing architecture and may improve a concurrent processing across the mixed-signal tiled computing architecture. In one or more preferred embodiments, when the task resource requirement exceeds the available resources on a tile then the task may be decomposed to run across multiple additional tiles and the results of the multiple tiles may be combined once all computations have been completed. As a non-limiting example, a task resource requirement may be the required memory for a task to successfully complete, required computing bandwidth for a task to successfully complete, required computing time for a task to successfully complete, required accuracy for a task to successfully complete, and/or any task constraint that may need to be met for the task to execute successfully when the task is executed. As another non-limiting example, if a given convolution operation exceeds the available resources of a tile, then the convolution operation may be transformed into a group of matrix multiply accelerator (MMA) operations that may run on multiple tiles and the result of each MMA may be added together or concatenated to create the result of the convolution operation. In such example, a task that exceeds an availability threshold of a tile may be decomposed or broken down into multiple sub-tasks in which each sub-task may be assigned to one computing tile or computing subsystem, such as an MMA of a group of MMA. In this way, parallelism and computing efficiencies may also be achieved in a simultaneous execution of the sub-tasks across the group of MMAs. As another non-limiting example, if a given convolution operation exceeds the available resources of a tile, then the convolution operation may be transformed into a group of MMA operations that may run on a single tile in series, the intermediate results stored, and the final results added together or concatenated.

In one or more preferred embodiments, one or more computing performance tuning parameters may be used in step S240. As a non-limiting example, the parameters may include low power mode, optimal performance mode, a frame rate an image and/or video processing neural network may be required to process at, number of tiles to limit the neural network to, available resources of one or more available tiles, and any other parameter that effects the performance of the task graph in a mixed-signal computing environment.

In one or more preferred embodiments, one or more of the tasks and/or buffers may be assigned to tiles. In addition, the tasks may be output in a programming language, e.g., C, C++, assemble code, and the like.

3.5 Buffer Tracking|Encoding Token-Based Task Scheduler (FSB)

S250, which includes identifying configuration parameters (programming code) and encoding a token-informed task scheduler, may function to generate buffer tracking parameters and a task scheduling configurations utilizing a token-informed task scheduler, as described in U.S. Pat. No. 10,606,797, which is incorporated herein in its entirety by this reference. The token-informed task scheduler may sometimes be referred to herein as a "flow scoreboard" module, "FSB", or the like. In one or more embodiments, the token-informed scheduler may be implemented by one or more hardware circuits of an integrated circuit (e.g., integrated circuit 100) that includes a plurality of distinct registers, dedicated memory circuits, and/or one or more processing circuits (e.g., a nano processor or the like).

According to one or more preferred embodiments, tasks may execute on tiled compute units, and tasks may communicate with each other by reading and writing data to a shared buffer or to a memory having a communal data buffer accessible by a plurality of distinct computing tiles on the integrated circuit. In such embodiments, tasks may have data dependencies that may need to be met before the task can execute and tasks may need to schedule access to the shared buffers in order to satisfy data dependencies. In one or more embodiments, S350 may function to identify data and/or task dependencies for each of a plurality of tasks and automatically create, via a compiler program, programming for encoding one or more hardware or circuit components associated with a token-informed scheduler in order to track the dependencies and identify a satisfaction thereof for automatically causing an execution or launch of a dependent task.

In one or more preferred embodiments, a performance of an integrated circuit may be improved when a task executes as soon as possible after the data dependencies are satisfied. According to one or more preferred embodiments, a task may start processing data once a sufficient amount of data has been written to its data buffer. In such embodiments, an amount of data for processing to start may vary depending on the stage of processing the task may be in. As a non-limiting example, a large chunk of data may be needed to start running a task while the subsequent amount of data needed to continue the task processing may be less.

According to one or more preferred embodiments, a shared buffer may be sized such that the buffer fits within the memory of the compute unit, and sized large enough where it is possible to overlap communication and computation such that an executing task may read from the buffer and the data for the next task to run may write to a separate location in the buffer. According to one or more preferred embodiments, the buffer may be a circular buffer where a task being executed may read or write between the tail and head of the circular buffer.

Figure 3A:
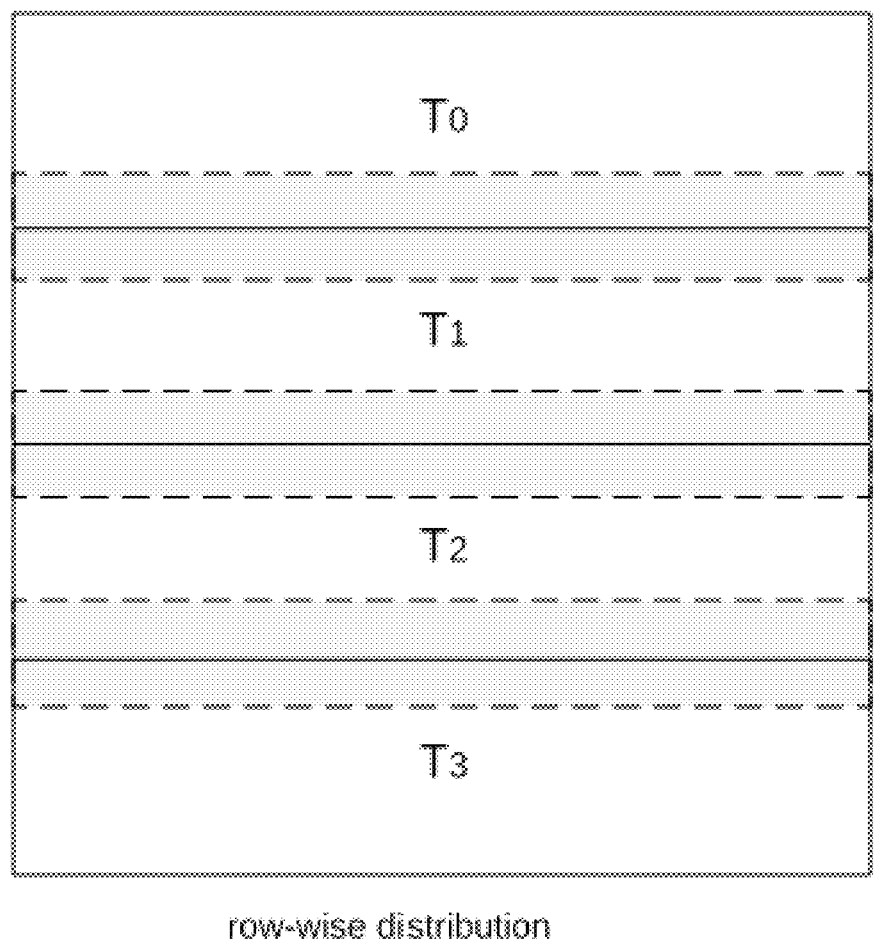
FIGS. 3A-3C illustrate distinct block data partitioning schematics of a buffer for a method of automated data flow and processing with an integrated circuit in accordance with one or more embodiments of the present application.
Figure 3B:
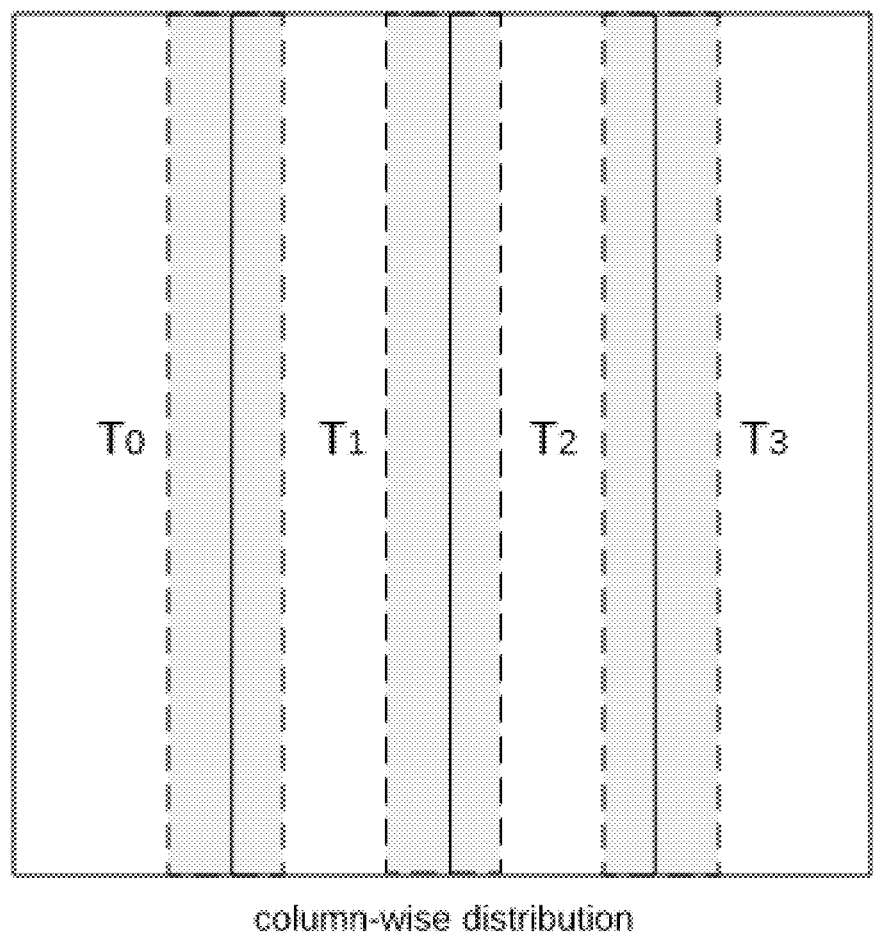
Figure 3C:
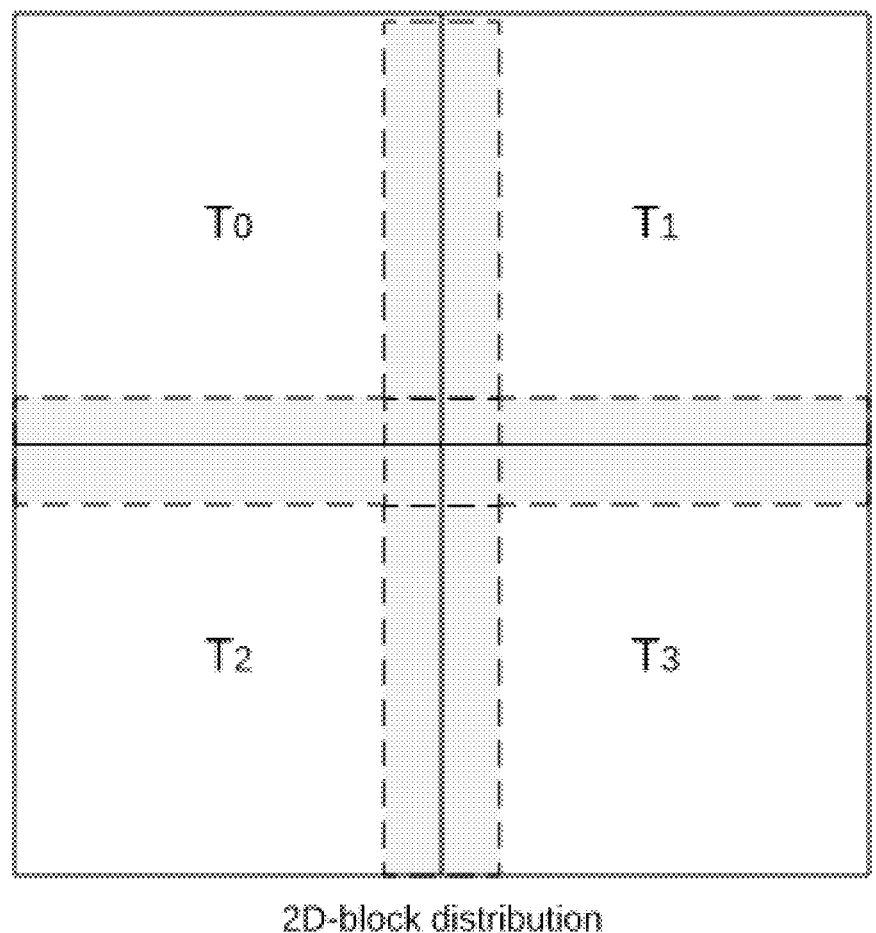

According to one or more preferred embodiments, block data partitioning may decompose a network operation by allocating a buffer to multiple tasks. The allocation may be row wise, column wise, 2D-block wise, ND-block wise (N being any suitable integer), or any other allocation including higher-dimensional generalizations that allows tasks to be allocated to a buffer. As shown in FIGS. 3A-C, a set of tasks T may share a buffer illustrated by the shaded region. FIG. 3A may illustrate a row wise allocation, FIG. 3B may illustrate a column wise allocation, and FIG. 3C may illustrate a 2D-block wise allocation. According to one or more preferred embodiments, one or more tasks may read the same buffer or sub-section of the buffer.

According to one or more preferred embodiments, a trigger condition or task launching may be when one or more dependencies of a task are met. In some embodiments, a launching condition as referred to sometimes herein as a trigger condition may relate to a requirement that one or more distinct tokens be observed within an integrated circuit or a given computing tile of the integrated circuit based on a completion of one or more tasks. It shall be noted that a token or a task token, such as a read token, write token, compute token, copy (in/out) token, and/or the like may be emitted by any of one or more components of an integrated circuit including, but not limited to, a nano processing circuit, an SRAM controller circuit, an streaming arithmetic logic unit (SALU) circuit, an MMA, and/or the like. In such embodiments, a trigger condition may be met when a threshold amount of data, as represented by an emission of one or more tokens, has been written to a buffer or when a task has read another threshold amount of data from a buffer. The preceding threshold amounts may be the same and may be changed based on the status of any component in the system. According to one or more preferred embodiments, one or more trigger conditions may be satisfied when associated input buffers may have enough input data to consume and/or output buffers may have enough space to produce output data.

According to one or more preferred embodiments, task scheduling may determine when a task may execute given that a set of one or more trigger conditions have been met. In such preferred embodiments, automated task scheduling may be implemented by a token-informed scheduler and based on encoding one or more token launching conditions and token counters for each of a plurality of executable tasks. According to one or more preferred embodiments, a launching condition for a task to execute may be met when all the task launching conditions for that task has been met. According to one or more preferred embodiments, trigger conditions may be met when other tasks that write and read from the buffer have completed the other tasks' respective writes or reads. As one or more other tasks write to and/or read from the buffer, one or more tokens may be generated and/or emitted based on the completion of the write and/or read tasks. In such embodiment, the emitted tokens may be tracked and/or counted by token counters that may be specifically associated with one or more task launching conditions. Thus, in one or more embodiments, the one or more values of the one or more token counters may satisfy the one or more task launching conditions (e.g., token counter value=0, etc.) and cause the token-informed task scheduler to automatically signal for an execution of a task associated or mapped to a given task launching condition that has been satisfied.

According to one or more preferred embodiments, a launcher task may perform task scheduling operations and place the task in a work queue, e.g., FIFO queue, for a compute unit.

According to one or more preferred embodiments, an iterator may generate an ordered sequence of one or more slices of a buffer. In such embodiments, the iterator may describe a sequence of buffer slices which may become an operand of an instance of a launcher task. As such, each iteration of an iterator may be an invocation of a launcher task.

According to one or more preferred embodiments, the flow scoreboard may track trigger conditions and may cause, at least partially, the task to execute. The flow scoreboard may coordinate how concurrently executing tasks access shared buffers and ensure trigger conditions are satisfied, as described in U.S. Pat. Nos. 10,606,797 and 10,521,395, which are both incorporated herein in their entireties by this reference.

Figure 4A:
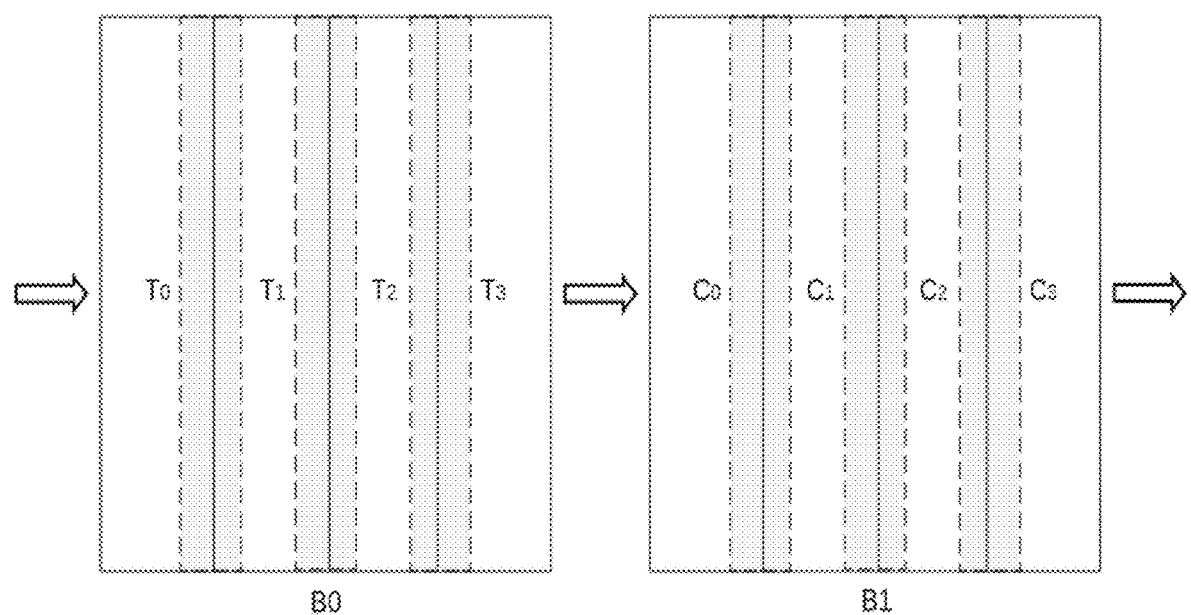
FIGS. 4A-4B illustrate a distinct block data partitioning schematic and a schematic for a dependency flor in accordance with one or more embodiments of the present application.
Figure 4B:
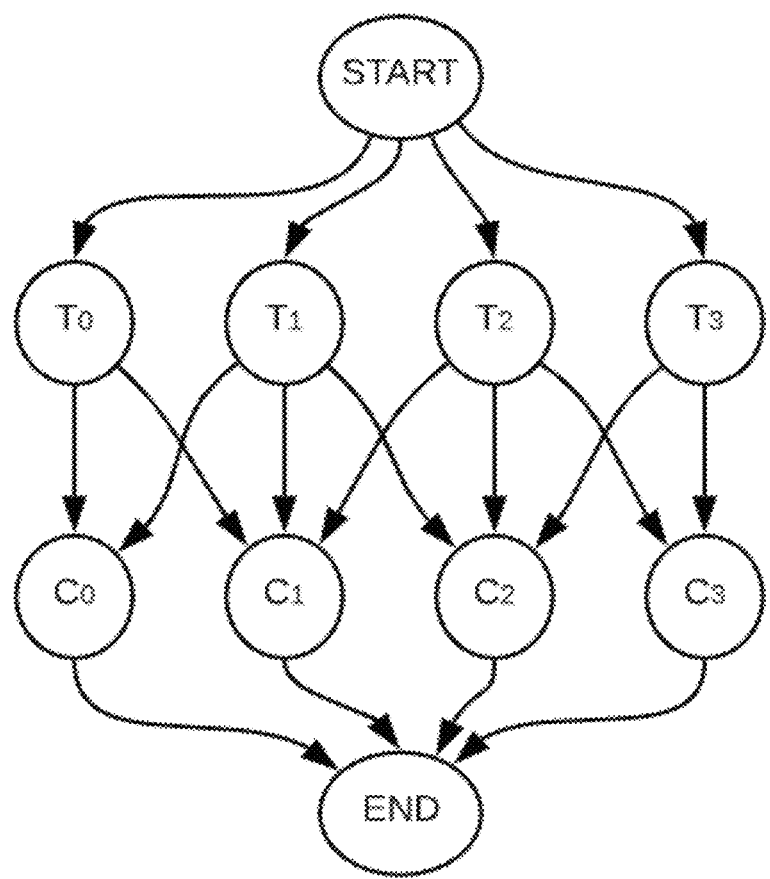

According to one or more preferred embodiments, buffer tracking may determine the configuration parameters of the flow scoreboard to trigger an execution of a task once that state of the input buffers and/or the output buffers trigger conditions are met. According to one or more preferred embodiments, the task graph may be decomposed into one or more launcher tasks by using block data partitioning, e.g., column-wise block data partitioning, as shown by way of example in FIG. 3. FIG. 4A and as illustrated alternatively in FIG. 4B. The block data partitioning may be repeated with the same block data partitioning type or with a different block data partitioning type, e.g., row-wise block data partitioning. Additionally, or alternatively, as illustrated by way of example in FIG. 4A and FIG. 4B, when the task graph may be decomposed input multiple buffers and launchers, there may be overlapping data dependencies (e.g., consumer domains overlap multiple producer domains, and vice versa). For example, in FIG. 4B, iterations of launcher task C0 depend on iterations of launcher tasks T0 and T1, so C0 and T0 would communicate with their data dependencies via tokens, and C0 and T1 would as well.

Additionally, or alternatively, in one or more preferred embodiments, when a launcher task executes, it may generate a compute task, and the associated input and output operands. The compute task may be placed in a queue, e.g., FIFO queue, of the compute task's corresponding compute unit. Each launcher task may be allocated a program entry in the flow scoreboard program table such that when the appropriate tokens are counted and/or collected, an associated launcher task may be automatically triggered or caused to execute. According to one or more preferred embodiments, the tasks may be assigned to compute units.

3.6 Code Generation

S260, which includes generating task, buffer, and FSB program code, may function to build program code based on an optimized task graph, task scheduling parameters, and FSB configuration parameters. According to one or more preferred embodiments, the generated code may be a high-level programming language, e.g., C, C++, and the like. According to one or more preferred embodiments, the number of bytes that are read and/or written from a buffer may vary between task execution. The number of bytes to read and/or write from a buffer may be stored in a static table that is consulted when a task is scheduled to execute.

According to one or more preferred embodiments, S260 may function to generate the code and encode each of a plurality of distinct circuits including one or more memory circuits (e.g., register files, a main data buffer, etc.) and/or one or more processing circuits or module implementing the token-informed scheduler and its associated components for implementing an intelligent tracking of one or more states of implemented buffers to optimize an automatic execution of a plurality of distinct tasks within one or more computing tiles of a given integrated circuit. For instance, the generated code/instructions/programming may be used to encode token counters and their associated values, task launching conditions, pointers from task launching conditions to executable tasks or programs, nano processors and other token emitting circuits, and/or the like.

The systems and methods of the preferred embodiments and variations thereof can be embodied and/or implemented at least in part as a machine configured to receive a computer-readable medium storing computer-readable instructions. The instructions are preferably executed by computer-executable components preferably integrated with the system and one or more portions of the processors and/or the controllers. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Although omitted for conciseness, the preferred embodiments include every combination and permutation of the various methods described herein.

As a person skilled in the art will recognize from the previous detailed description and from the figures and claims, modifications and changes can be made to the preferred embodiments of the invention without departing from the scope of this invention defined in the following claims.

What is claimed is:

1. A method for optimizing data flow in an integrated circuit based on state data of one or more data buffers, the method comprising:
   (A) creating a task graph based on transforming an optimized network graph for an application, wherein creating the task graph includes:
      (i-a) enumerating a plurality of distinct tasks based on a decomposition of each of a plurality of network operations of the optimized network graph; and
      (ii-a) allocating a data buffer to each of one or more distinct pairs of dependent tasks of the plurality of distinct tasks based on the decomposition of each of the plurality of network operations of the optimized network graph;
   (B) encoding a token-informed task scheduler based on a composition of the task graph, wherein the encoding the token-informed task scheduler includes:
      programming the token-informed task scheduler to cause an execution of one or more of the plurality of distinct tasks based on identifying a state of a respective data buffer between each of the one or more distinct pairs of dependent tasks.

2. The method according to claim 1, wherein
the encoding the token-informed task scheduler includes:
   programming the token-informed task scheduler to:
      (1) track a plurality of distinct tokens emitted by one or more distinct components of the integrated circuit; and
      (2) identify whether a collection of the plurality of distinct tokens satisfy one or more task launching conditions associated with one or more of the plurality of distinct tasks.

3. The method according to claim 1, wherein:
   (1) the decomposition of each of the plurality of network operations includes:
      translating each of the plurality of network operations of the optimized network graph to a set of task sequences that includes a set of the plurality of distinct tasks arranged in chronologically dependent order;
   (2) allocating the data buffer includes:
      allocating an instance of the data buffer between each sequential pair of tasks in the set of task sequences.

4. The method according to claim 1, wherein
identifying the state of the respective data buffer includes:
   identifying one or more tokens that are emitted by a component of the integrated circuit based on an execution of one or more dependent tasks of the plurality of distinct pairs of dependent tasks performing one of a read operation of and a write operation to the respective data buffer.

5. The method according to claim 1, wherein
each of a first dependent task and a second dependent task of a distinct pair dependent tasks of the plurality of distinct pairs of dependent tasks interface through the respective data buffer allocated between the distinct pair of dependent tasks.

6. The method according to claim 1, wherein
encoding the token-informed task scheduler includes:
   programming a distinct task launching condition for each of the plurality of distinct tasks, wherein the distinct task launching condition includes a requirement that one or more distinct tokens be observed within the integrated circuit based on a completion of one or more tasks.

7. The method according to claim 6, further comprising:
programming one or more token counters for the distinct task launching condition, wherein the one or more token counters count one or more distinct tokens emitted by one or more components of the integrated circuit.

8. The method according to claim 7, wherein
identify the state of the respective target buffer includes:
   evaluating a value of the one or more token counters against the distinct task launching condition for each of the plurality of tasks.

9. The method according to claim 1, wherein
the token-informed task scheduler tracks one or more of a read token and a write token produced based on a distinct pair of tasks performing one or more of a read operation of and a write operation to the respective data buffer associated with the distinct pair of tasks.

10. The method according to claim 1, wherein
each of the one or more distinct pairs of dependent tasks includes:
   (1) a first task that performs a write operation to the at least one data buffer; and
   (2) a second task that performs one of a read operation and a write operation to the at least one data buffer only after a completion of the first task.

11. The method according to claim 1, wherein
each of the one or more distinct pairs of dependent tasks includes:
   (1) a first task that performs a read operation to the at least one data buffer; and
   (2) a second task that performs one of a read operation and a write operation to the at least one data buffer only after a completion of the first task.

12. The method according to claim 1, wherein
a first dependent task of the one or more distinct pairs of dependent tasks interfacing with the respective data buffer causes an emission of a distinct token that is tracked by the token-informed task scheduler to cause an automatic execution of a second dependent task of the one or more distinct pairs if the distinct token causes a satisfaction of a task launching condition of the second dependent task.

13. A system for optimizing data flow and an execution of integrated circuit tasks in an integrated circuit, the system comprising:
   a data buffer in a memory;
   a token-informed task scheduler;
   a computer implementing an intelligent compiler program that creates a task graph based on transforming an optimized network graph for a neural network application, wherein creating the task graph includes:
- (i-a) enumerating a plurality of distinct integrated circuit tasks based on a decomposition of each of a plurality of network operations of the optimized network graph; and
- (ii-a) allocating a data buffer slice of the data buffer in the memory to each of one or more distinct pairs of dependent integrated circuit tasks of the plurality of distinct integrated circuit tasks based on the decomposition of each of the plurality of network operations of the optimized network graph;

wherein the computer encodes a token-informed task scheduler based on a composition of the task graph, wherein the encoding the token-informed task scheduler includes:
- programming the token-informed task scheduler to cause an execution of one or more of the plurality of distinct integrated circuit tasks based on identifying a state of a respective data buffer between each of the one or more distinct pairs of dependent integrated circuit tasks.

14. The system according to claim 13, wherein
the encoding the token-informed task scheduler includes:
programming the token-informed task scheduler to:
- (1) track a plurality of distinct tokens emitted by one or more distinct components of the integrated circuit; and
- (2) identify whether a collection of the plurality of distinct tokens satisfy one or more task launching conditions associated with one or more of the plurality of distinct integrated circuit tasks.

15. The system according to claim 13, wherein:
the computer encodes a task token counter to increment or decrement based on one or more occurrences of one or more distinct task tokens within the integrated circuit; and
the encoding the token-informed task scheduler includes encoding one or more task launching conditions that, when satisfied by one or more occurrences of the one or more distinct task tokens, causes the token-informed task scheduler to automatically launch one or more of the plurality of distinct integrated circuit tasks.

* * * * *